United States Patent
Chou et al.

(10) Patent No.: US 9,991,136 B2
(45) Date of Patent: *Jun. 5, 2018

(54) LEADFRAME AND THE METHOD TO FABRICATE THEREOF

(71) Applicant: CYNTEC CO., LTD., Hsinchu (TW)

(72) Inventors: Chia Pei Chou, Hsinchu (TW); Lang-Yi Chiang, Hsinchu County (TW); Jih-Hsu Yeh, Taipei (TW); You Chang Tseng, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/592,190

(22) Filed: May 10, 2017

(65) Prior Publication Data

US 2017/0323799 A1    Nov. 9, 2017

Related U.S. Application Data

(63) Continuation of application No. 14/337,232, filed on Jul. 22, 2014, now Pat. No. 9,691,633.

(60) Provisional application No. 61/857,270, filed on Jul. 23, 2013.

(51) Int. Cl.
| | |
|---|---|
| *H05K 1/11* | (2006.01) |
| *H01L 21/48* | (2006.01) |
| *H01L 23/495* | (2006.01) |
| *H01L 23/498* | (2006.01) |

(52) U.S. Cl.
CPC .......... *H01L 21/486* (2013.01); *H01L 23/495* (2013.01); *H01L 23/49811* (2013.01); *H01L 23/4952* (2013.01); *H01L 23/49827* (2013.01); *H01L 2924/00* (2013.01); *H01L 2924/0002* (2013.01); *Y10T 29/49117* (2015.01)

(58) Field of Classification Search
USPC .................................................. 174/266, 250
See application file for complete search history.

(56) References Cited

U.S. PATENT DOCUMENTS

2005/0194695 A1* 9/2005 Lin ........................ H01L 24/11
257/777

\* cited by examiner

*Primary Examiner* — Andargie M Aychillhum
(74) *Attorney, Agent, or Firm* — Min-Lee Teng; Litron Patent & Trademark Office

(57) ABSTRACT

The present invention discloses a leadframe in which two conductive pillars with a high aspect ratio and the corresponding two leads of the leadframe form a 3D space for accommodating at least one device. A first lead and a second lead are spaced apart from each other. A first conductive pillar is formed on the first lead by disposing a first via on the first lead, wherein at least one first conductive material is filled inside the first via to form the first conductive pillar. A second conductive pillar is formed on the second lead by disposing a second via on the second lead, wherein at least one second conductive material is filled inside the second via to form the second conductive pillar. The first lead, the second lead, the first conductive pillar, and the second conductive pillar form a 3D space for accommodating at least one device, wherein the at least one device is electrically connected to the first conductive pillar and the second conductive pillar.

20 Claims, 23 Drawing Sheets

LEADFRAME AND THE METHOD TO FABRICATE THEREOF

CROSS REFERENCE TO RELATED APPLICATIONS

This application is a continuation of U.S. application Ser. No. 14/337,232, filed Jul. 22, 2014, which claims the benefit of U.S. provisional application Ser. No. 61/857,270, filed Jul. 23, 2013, which is incorporated by referenced herein in their entirety.

BACKGROUND OF THE INVENTION

I. Field of the Invention

The present invention relates to a leadframe, and in particular, to a leadframe forming a 3D space.

II. Description of the Prior Art

A leadframe is a material for an IC package and can be in variety of forms, such as QFP, TSOP, SOT or SOJ. The molded semiconductor devices are constructed by assembling and interconnecting a semiconductor device to a leadframe. The structure is often molded with plastic material. A leadframe is made by a metal ribbon with a paddle (also known as a die paddle, die-attach tab, or island) for attaching a semiconductor device thereto and a plurality of leads arranged in a manner such that the leads do not overlap the paddle on which the semiconductor device is to be mounted.

Conventionally, a leadframe is used for die bond of an IC chip. The process flow includes many stages which comprise wire bonding, molding of IC chip, and the tests after trimming or forming. Various products can be made by integrating or packaging the leadframe with other devices such as inductors or capacitors. It's one of the main package processes in the industry due to its easiness, maturity and better reliability.

The leadframe described above is usually in the form of plane so that product size doesn't shrink. Besides, it is only good for packaging a single device. However, when the size of the device shrinks, a leadframe having a 3D space for accommodating at least one device is needed. The deformation of the leadframe may further affect the product yield. Accordingly, the present invention proposes a leadframe and its manufacturing method to overcome the above-mentioned disadvantages.

SUMMARY OF THE INVENTION

One objective of the present invention is to provide a leadframe comprising: a first lead and a second lead spaced apart from each other; a first conductive pillar formed on the first lead by disposing a first via on the first lead, wherein at least one first conductive material is filled inside the first via to form the first conductive pillar; and a second conductive pillar formed on the second lead by disposing a second via on the second lead, wherein at least one second conductive material is filled inside the second via to form the second conductive pillar; wherein the first lead, the second lead, the first conductive pillar, and the second conductive pillar form a 3D space for accommodating at least one device, wherein the at least one device is electrically connected to the first conductive pillar and the second conductive pillar.

In one embodiment of the present invention, the top of the first conductive pillar, the top of the second conductive pillar and the top of at least two terminals of at least one device are substantially at the same horizontal level.

In one embodiment of the present invention, a supporting material is disposed between the first lead and the second lead to support the at least one device.

In one embodiment of the present invention, a first bump and a second bump are respectively disposed on the first conductive pillar and the second conductive pillar for connecting with the at least one device.

In one embodiment of the present invention, the at least one device is a magnetic device having a coil, wherein the coil has a first terminal and a second terminal, wherein the first lead is electrically connected to the first terminal of the coil through the first conductive pillar, and the second lead is electrically connected to the second terminal of the coil through the second conductive pillar.

Another objective of the present invention is to provide a method for forming a leadframe. The method comprises the steps of: providing a first lead and a second lead spaced apart from each other; and performing a patterning process to form a first conductive pillar and a second conductive pillar respectively on the first lead and the second lead; wherein the first lead, the second lead, the first conductive pillar, and the second conductive pillar form a 3D space for accommodating at least one device, wherein the at least one device is electrically connected to the first conductive pillar and the second conductive pillar.

Another objective of the present invention is to provide a method for forming a leadframe. The method comprises the steps of: providing a substrate having a first portion, a second portion and a third portion between the first portion and the second portion; and performing a patterning process to form a first conductive pillar and a second conductive pillar respectively on the first portion and the second portion of the substrate and to remove the third portion of the substrate such that the first portion and the second portion of the substrate respectively define a first lead and a second lead spaced apart from each other; wherein the first lead, the second lead, the first conductive pillar, and the second conductive pillar form a 3D space for accommodating at least one device, wherein the at least one device is electrically connected to the first conductive pillar and the second conductive pillar.

The detailed technology and above preferred embodiments implemented for the present invention are described in the following paragraphs accompanying the appended drawings for people skilled in the art to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as follows. The described preferred embodiments are presented for purposes of illustrations and descriptions and they are not intended to limit the scope of the present invention.

The following embodiments disclose a leadframe and a method for manufacturing the leadframe. The following embodiments also disclose a three-dimensional package structure and a method for manufacturing the three-dimensional package structure. Two conductive pillars with a high aspect ratio and the corresponding two leads of the leadframe forms a 3D space for accommodating at least one device. Two conductive pillars can be formed by a patterning process (e.g., lithography process) to match the requirement of the device size.

Figure 1A:
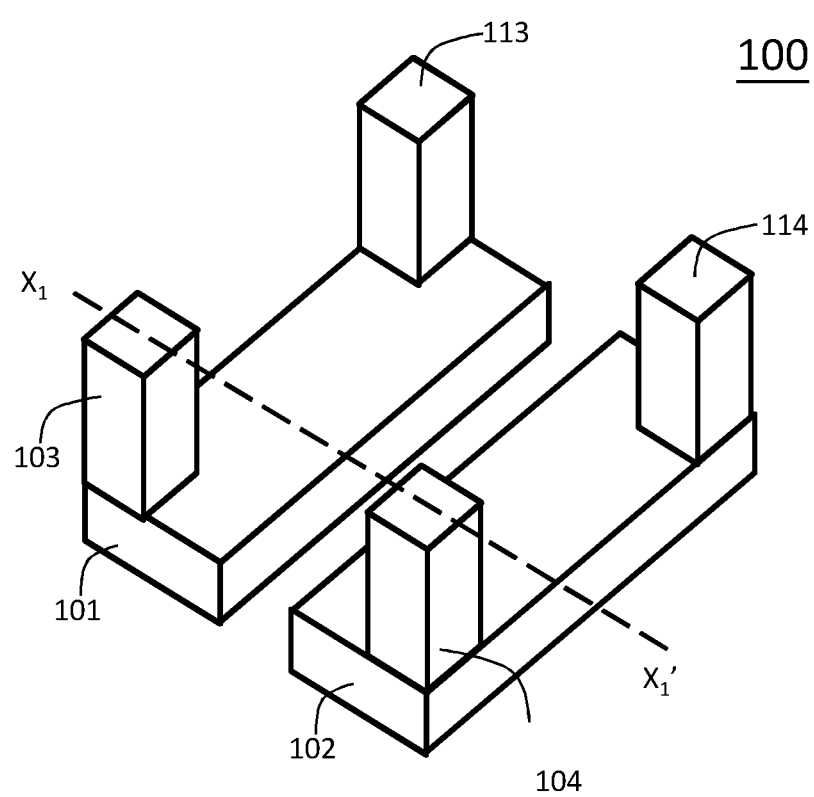
FIG. 1A illustrates a schematic three-dimensional view of a leadframe in accordance with the present invention.
Figure 1B:
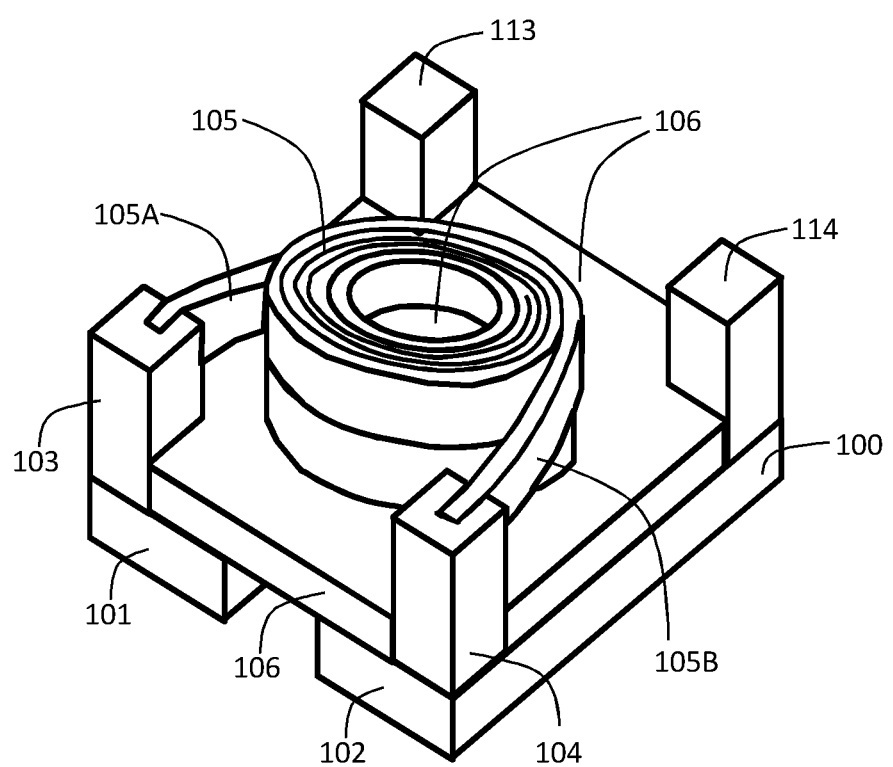
FIG. 1B illustrates a schematic three-dimensional view of a package structure where at least one device is accommodated in a 3D space formed by the leadframe in FIG. 1A in accordance with the present invention.

FIG. 1A illustrates a schematic three-dimensional view of a leadframe 100 in accordance with the present invention. The leadframe comprises: a first lead 101 and a second lead 102 spaced apart from each other; a first conductive pillar 103 formed on the first lead 101 by disposing a first via on the first lead 101, wherein at least one first conductive material is filled inside the first via to form the first conductive pillar 103; and a second conductive pillar 104 formed on the second lead 102 by disposing a second via on the second lead 102, wherein at least one second conductive material is filled inside the second via to form the second conductive pillar 104; wherein the first lead 101, the second lead 102, the first conductive pillar 103, and the second conductive pillar 104 forms a 3D space for accommodating at least one device, wherein the at least one device is electrically connected to the first conductive pillar 103 and the second conductive pillar 104. Preferably, the first conductive material is the same as the second conductive material. FIG. 1B illustrates a schematic three-dimensional view of a package structure where at least one device 105 is accommodated in a 3D space formed by the leadframe 100 in FIG. 1A in accordance with the present invention. In one embodiment, the first conductive pillar 103 and the second conductive pillar 104 are respectively formed on the first corner of the first lead 101 and the second corner of the second lead 102 to form a maximum 3D space for accommodating at least one device. Both of the first conductive pillar 103 and the second conductive pillar 104 has a high aspect ratio. Optionally, a molding material (not shown) can encapsulate at least one device 105.

Figure 1C:
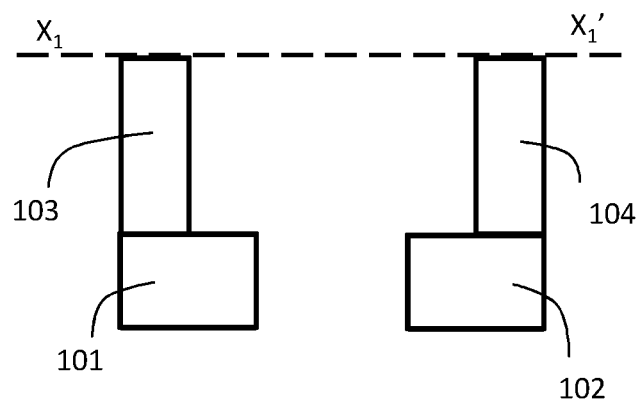
FIG. 1C illustrates a schematic cross-sectional view of the leadframe in FIG. 1A.
Figure 1D:
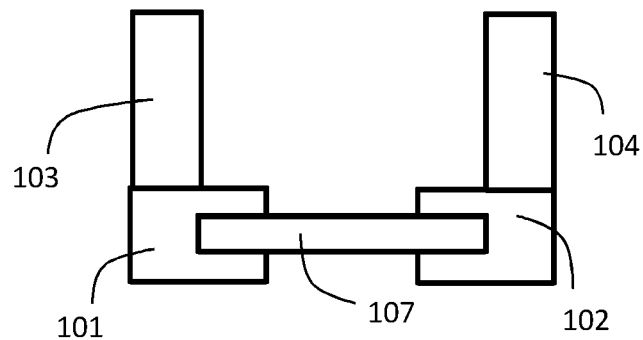
FIG. 1D illustrates a schematic three-dimensional view of a leadframe where a supporting material is disposed between the first lead and the second lead in accordance with the present invention.

FIG. 1C illustrates a schematic cross-sectional view of the leadframe 100 in FIG. 1A. In reference to both FIG. 1A and FIG. 1C together, section X1-X1' in FIG. 1C is taken along line X1-X1' shown in FIG. 1A. At least one device 105 comprises at least one of an IC chip, a MOSFET, an IGBT, a diode, a resistor, an inductor, a choke or a capacitor. In one embodiment, a supporting material 107 can be disposed between the first lead 101 and the second lead 102 to support at least one device 105 (see FIG. 1D).

Preferably, the device 105 is a magnetic device having a coil. Please refer back to FIG. 1A and FIG. 1B, the coil has a first terminal 105A and a second terminal 105B. The first lead 101 is electrically connected to the first terminal 105A of the coil through the first conductive pillar 103, and the second lead 102 is electrically connected to the second terminal 105B of the coil through the second conductive pillar 104. Preferably, a core body 106 (e.g., T core) is disposed on the leadframe 100, and a coil is disposed on the core body 106.

The top of the first conductive pillar 103, the top of the second conductive pillar 104 and the top of at least two terminals of at least one device 105 can be substantially at the same horizontal level for convenience to electrically connect at least one device 105 to the first conductive pillar 103 and the second conductive pillar 104 and to perform a patterning process (e.g., lithography process) to manufacture the package structure. In other words, the height of the first conductive pillar 103, the height of the second conductive pillar 104 and the height of at least one device 105 is the same.

Figure 2A:
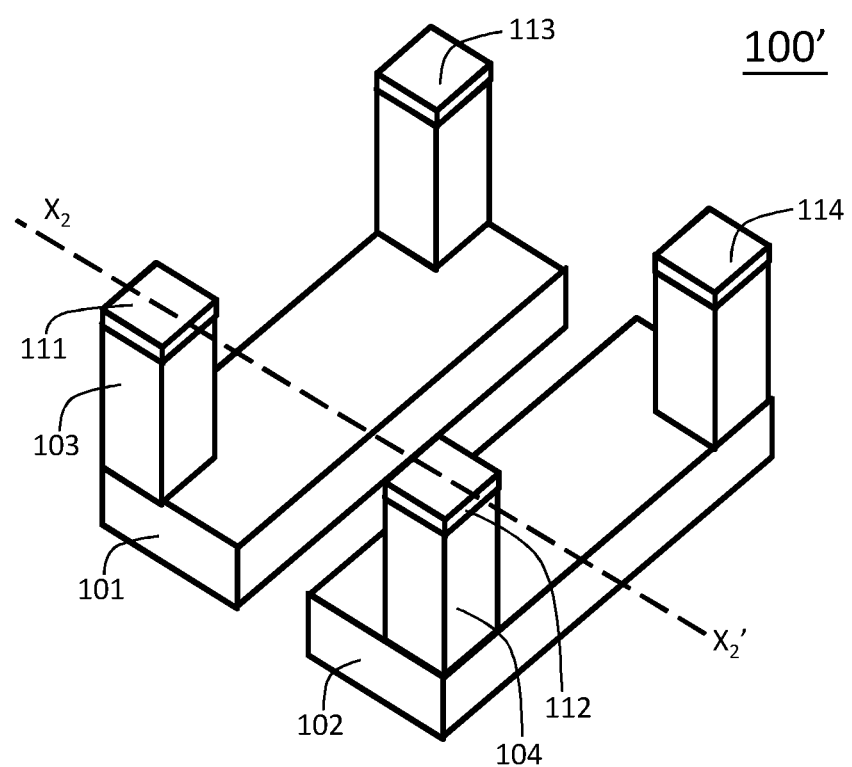
FIG. 2A illustrates a schematic three-dimensional view of a leadframe having a first bump and a second bump in accordance with the present invention.
Figure 2B:
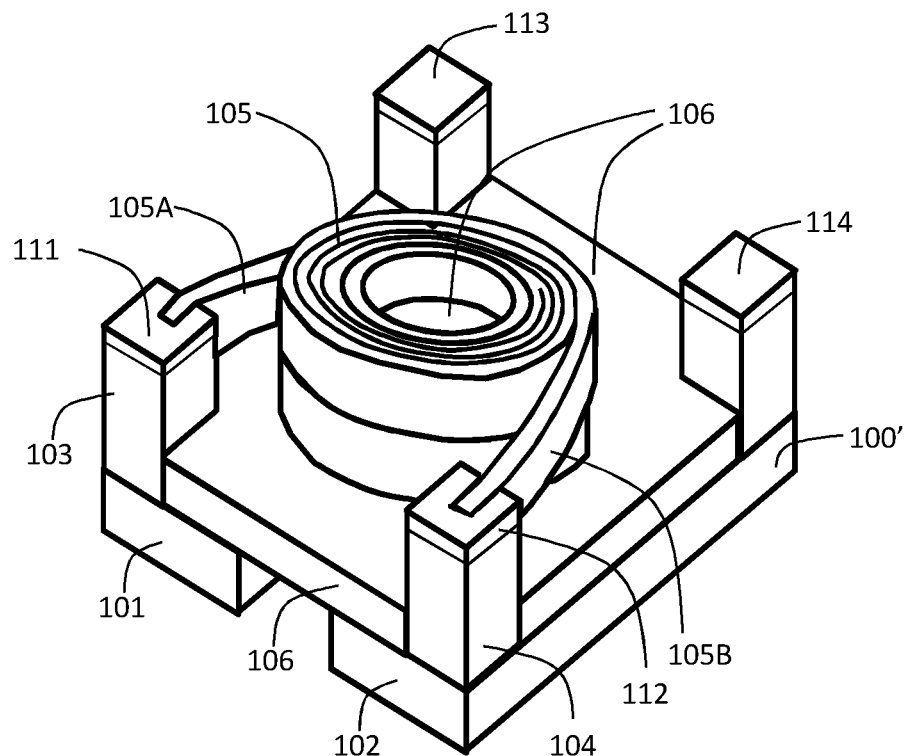
FIG. 2B illustrates a schematic three-dimensional view of a package structure where at least one device is accommodated in a 3D space formed by the leadframe in FIG. 2A in accordance with the present invention.
Figure 2C:
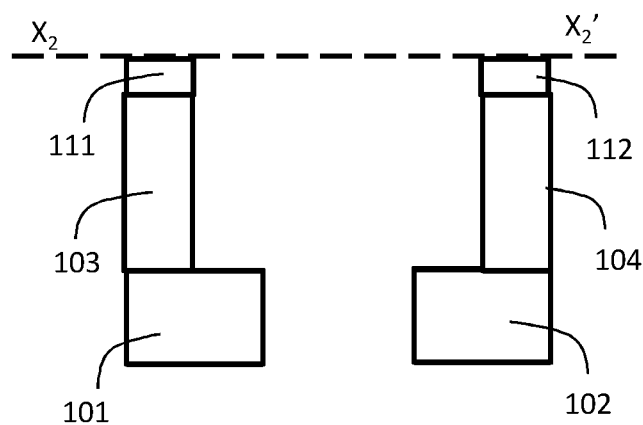
FIG. 2C illustrates a schematic cross-sectional view of the leadframe in FIG. 2A.

FIG. 2A illustrates a schematic three-dimensional view of a leadframe 100' having a first bump 111 and a second bump 112 in accordance with the present invention. FIG. 2B illustrates a schematic three-dimensional view of a package structure where at least one device 105 is accommodated in a 3D space formed by the leadframe 100' in FIG. 2A in accordance with the present invention. FIG. 2C illustrates a schematic cross-sectional view of the leadframe 100' in FIG. 2A. In reference to both FIG. 2A and FIG. 2C together, section X2-X2' in FIG. 2C is taken along line X2-X2' shown in FIG. 2A.

A first bump 111 and a second bump 112 can be respectively disposed on the first conductive pillar 101 and the second conductive pillar 102 for connecting with at least one device 105. Preferably, the top of the first bump 111, the top of the second bump 112 and the top of at least two terminals of at least one device 105 can be substantially at the same horizontal level for convenience to electrically connect at least one device 105 to the first conductive pillar 103 and the second conductive pillar 104.

Please refer back to FIG. 1A, FIG. 1B, FIG. 2A and FIG. 2B. Optionally, a third pillar 113 and a fourth pillar 114 can be respectively disposed on the first lead 101 and the second lead 102 to fix at least one device 105. Preferably, the third pillar 113 and the fourth pillar 114 are respectively formed on the third corner of the first lead 101 and the fourth corner of the second lead 102 to form a maximum 3D space for accommodating at least one device 105. Optionally, each of the third pillar 113 and the fourth pillar 114 can be a conductive pillar. The top of the first conductive pillar 103, the top of the second conductive pillar 104, the top of the third pillar 113, the top of the fourth pillar 114 and the top of at least two terminals of at least one device 105 are substantially in the same horizontal level for convenience to perform a patterning process (e.g., lithography process) to manufacture the package structure. In other words, the height of the first conductive pillar 103, the height of the second conductive pillar 104, the height of the third pillar 113, the height of the fourth pillar 114 and the height of at least one device 105 is the same.

Figure 3:
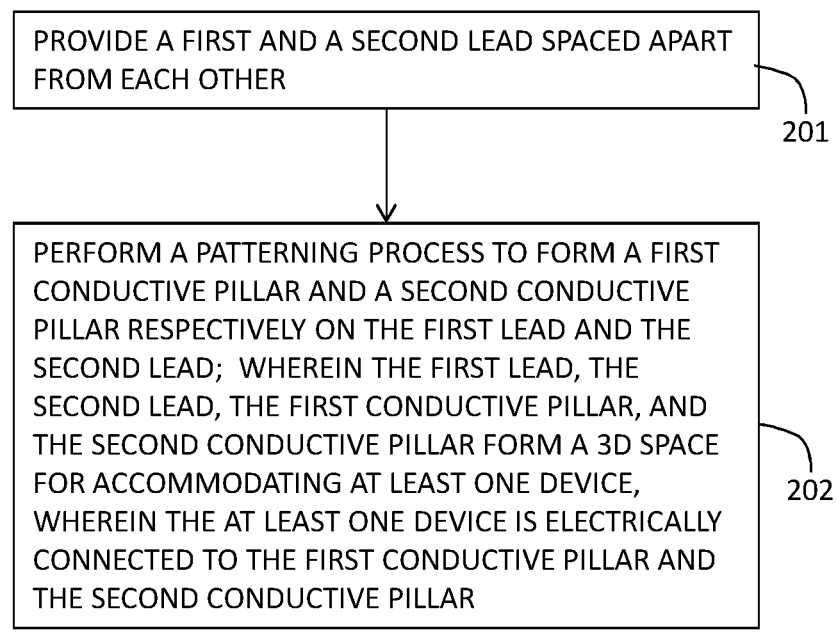
FIG. 3 is a process flow of manufacturing the leadframe.

FIG. 3 is a process flow of manufacturing the leadframe. In a step 201, provide a first lead and a second lead spaced apart from each other. In a step 202, perform a patterning process (e.g., lithography process) to form a first conductive pillar and a second conductive pillar respectively on the first lead and the second lead; wherein the first lead, the second lead, the first conductive pillar, and the second conductive pillar form a 3D space for accommodating at least one device, wherein the at least one device is electrically connected to the first conductive pillar and the second conductive pillar.

The step 202 comprises: forming an insulating layer on the first lead and the second lead; forming a first through-hole and a second through-hole in the insulating layer to expose the first lead and the second lead respectively; filling at least one conductive material in a first through-hole and a second through-hole respectively to form the first conductive pillar and the second conductive pillar; and removing the insulating layer.

Figure 4:
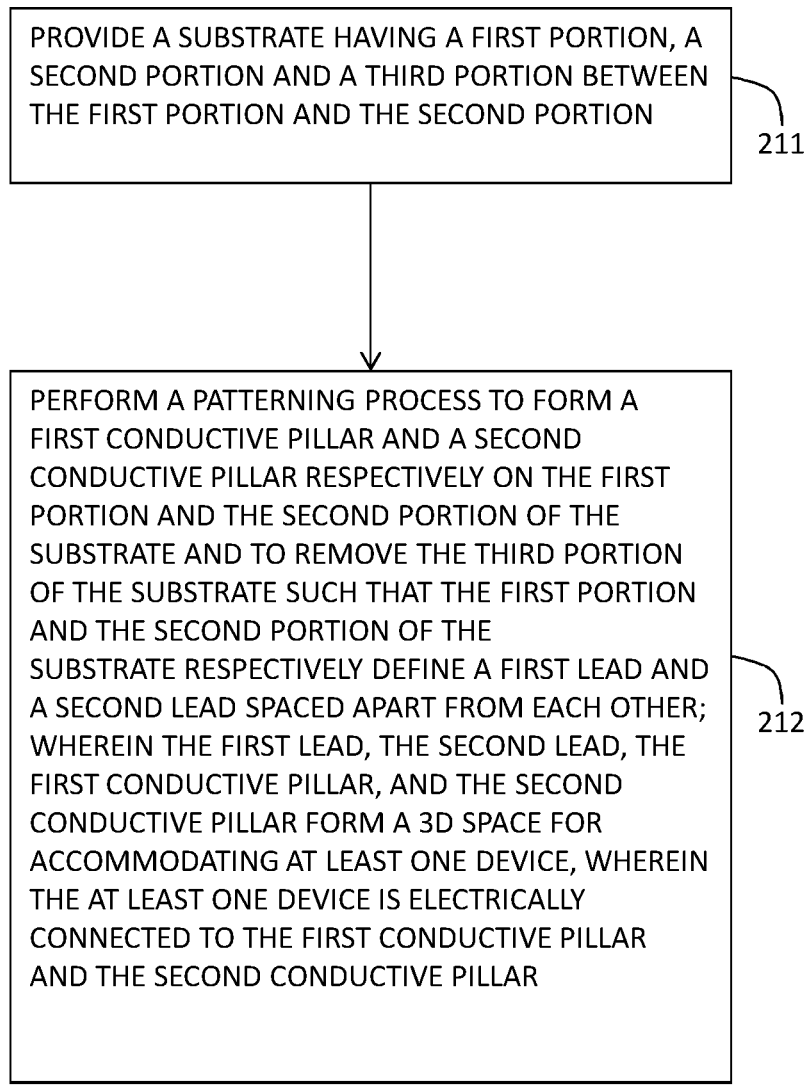
FIG. 4 is another process flow of manufacturing the leadframe.

FIG. 4 is another process flow of manufacturing the lead frame. In a step 211, provide a substrate having a first portion, a second portion and a third portion between the first portion and the second portion. In a step 212, perform a patterning process (e.g., lithography process) to form a first conductive pillar and a second conductive pillar respectively on the first portion and the second portion of the substrate and to remove the third portion of the substrate such that the first portion and the second portion of the substrate respectively define a first lead and a second lead spaced apart from each other; wherein the first lead, the second lead, the first conductive pillar, and the second conductive pillar form a 3D space for accommodating at least one device, wherein the at least one device is electrically connected to the first conductive pillar and the second conductive pillar.

Performing a patterning process to form a first conductive pillar and a second conductive pillar respectively on the first portion and the second portion of the substrate in the step 212 comprises: forming an insulating layer on the first portion and the second portion; forming a first through-hole and a second through-hole in the insulating layer to expose the first portion and the second portion respectively; filling at least one conductive material in a first through-hole and a second through-hole respectively to form the first conductive pillar and the second conductive pillar; and removing the insulating layer.

The following four embodiments disclose a detailed process-flow-chart of manufacturing the leadframe described in FIG. 3 and FIG. 4.

Embodiment 1

Figure 5A:
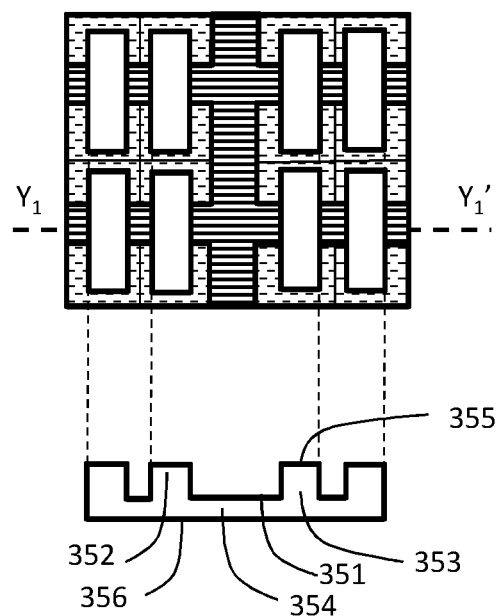
FIG. 5A to FIG. 5H illustrate a detailed process-flow-chart of manufacturing the leadframe in the first embodiment of the present invention.

In the first embodiment of the present invention, the base material is a metallic substrate 351 (e.g., Cu foil) (see FIG. 5A). For convenience of explanation, only a local patterning process (e.g., lithography process) is shown; however, people skilled in the art can understand that the patterning process can be performed globally for mass production.

FIG. 5A illustrates a top view of a metallic substrate 351 after braunification and a Y1-Y1' cross-sectional view of the metallic substrate 351 after braunification. The metallic substrate 351 comprises a first portion 352, a second portion 353 and a third portion 354 between the first portion 352 and the second portion 353. The metallic substrate 351 has a first surface 355 and a second surface 356 opposite to the first surface 355.

Figure 5B:
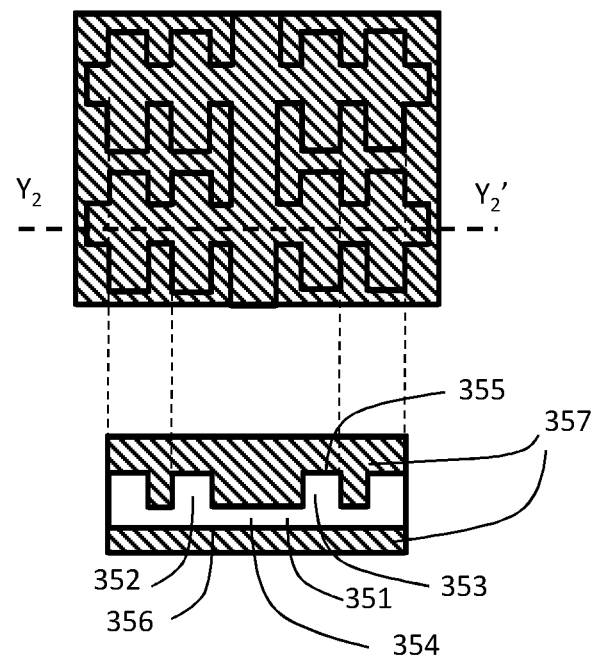

Then, a first insulating layer 357 can be formed on both of the first surface 355 and the second surface 356 of the metallic substrate 351 (see FIG. 5B; a top view and a Y2-Y2' cross-sectional view). Optionally, two insulating layers can be respectively formed on both of the first surface 355 and the second surface 356 of the metallic substrate 351.

Figure 5C:
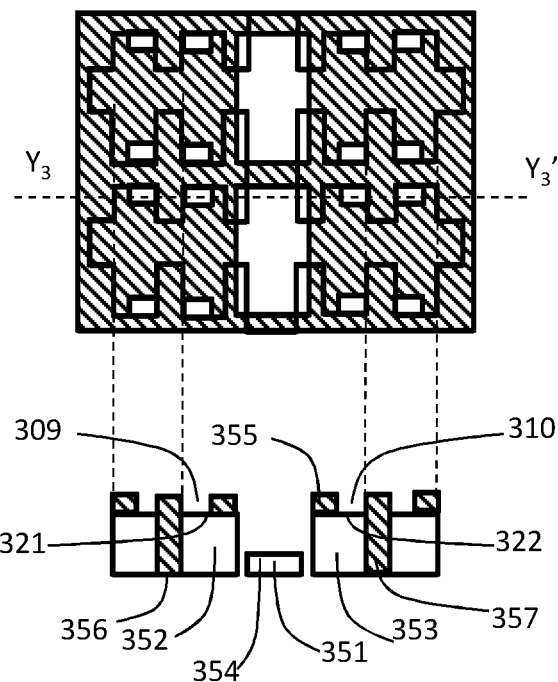

Then, a first through-hole 309 and a second through-hole 310 can be formed in the first insulating layer 357 on the first surface 355 of the metallic substrate 351 to expose a first contact area 321 of the first portion 352 and a second contact area 322 of the second portion 353, and the first insulating layer 357 on the second surface 356 of the metallic substrate 351 can be removed (see FIG. 5C; a top view and a Y3-Y3' cross-sectional view). Preferably, the first contact area 321 and the second contact area 322 are respectively located at the first corner of the first portion 352 and the second corner of the second portion 353 to form a maximum 3D space for accommodating at least one device 105.

Figure 5D:
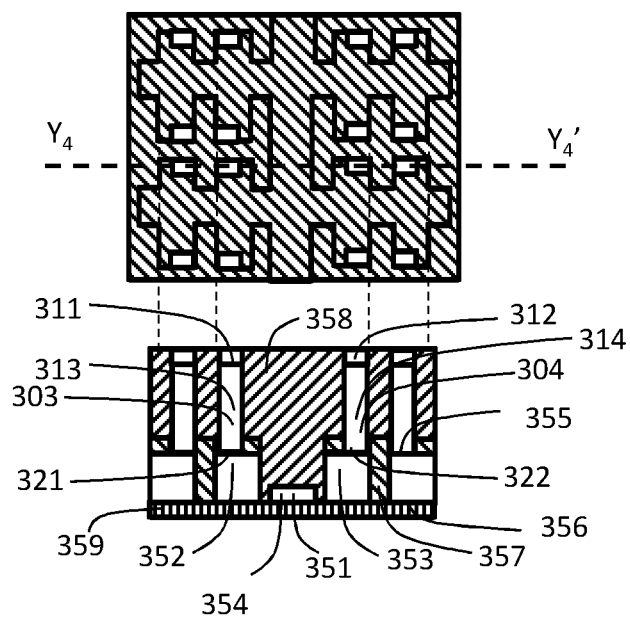

Then, a second insulating layer 358 (e.g., photoresistor) can be formed on the first insulating layer 357. Then, a third through-hole 313 and a fourth through-hole 314 can be formed in the first insulating layer 357 and the second insulating layer 358 to expose the first contact area 321 of the first portion 352 and the second contact area 322 of the second portion 353. Preferably, the first contact area 321 and the second contact area 322 are respectively located at the first corner of the first portion 352 and the second corner of the second portion 353 to form a maximum 3D space for accommodating at least one device 105. Then, a first conductive pillar 303 and a second conductive pillar 304 can be respectively formed on the first contact area 321 and the second contact area 322. Optionally, a first bump 311 and a second bump 312 can be respectively formed on the first conductive pillar 303 and the second conductive pillar 304 (see FIG. 5D; a top view and a Y4-Y4' cross-sectional view). The first bump 311 and the second bump 312 can be formed by any suitable material, such as Cu/Sn. Then, a third insulating layer 359 can be formed on the second surface 356 of the metallic substrate 351.

Figure 5E:
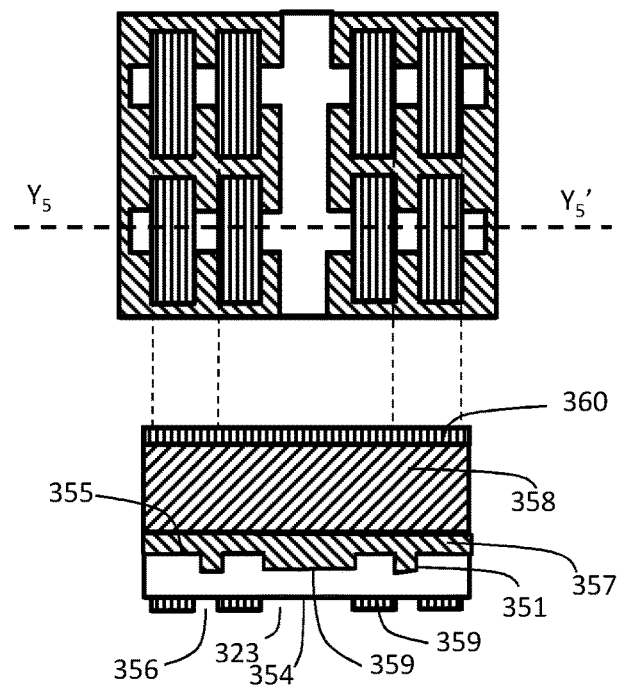

Then, a fourth insulating layer 360 can be formed on the second insulating layer 358. Then, a first through-trench 323 can be formed in the third insulating layer 359 on the second surface 356 of the metallic substrate 351 to expose the third portion 354 of the metallic substrate 351 (see FIG. 5E; a bottom view and a Y5-Y5' cross-sectional view).

Figure 5F:
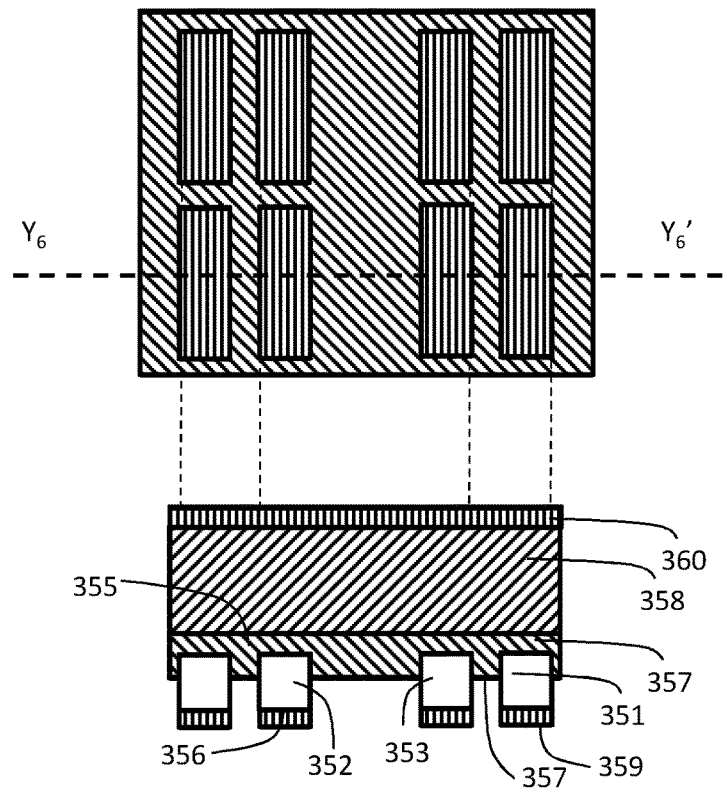

Then, the third portion 354 of the metallic substrate 351 can be removed by performing an etching process on the second surface 356 of the metallic substrate 351 such that the first portion 352 and the second portion 353 are spaced apart to form the first lead 101 and the second lead 102 of the leadframe 100 (see FIG. 5F; a bottom view and a Y6-Y6' cross-sectional view).

Figure 5G:
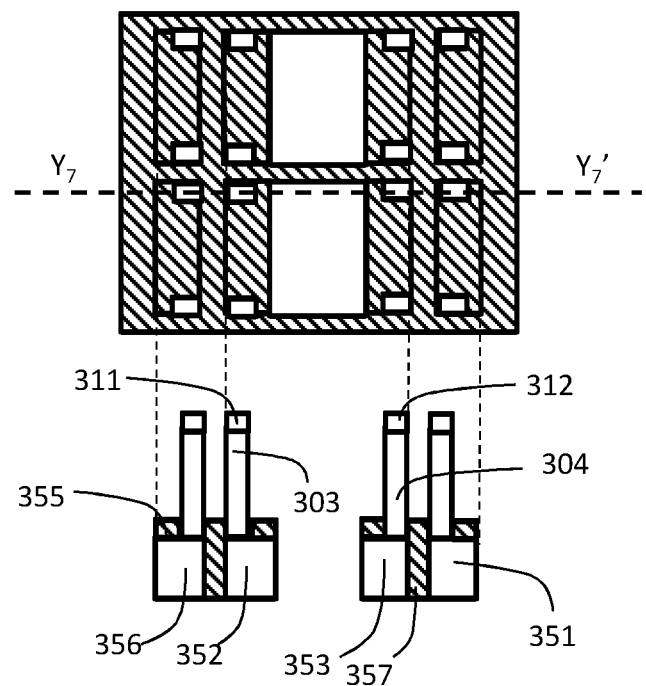

Then, the second insulating layer 358 (e.g., photoresistor), the third insulating layer 359 and the fourth insulating layer 360 can be removed (see FIG. 5G; a top view and a Y7-Y7' cross-sectional view).

Figure 5H:
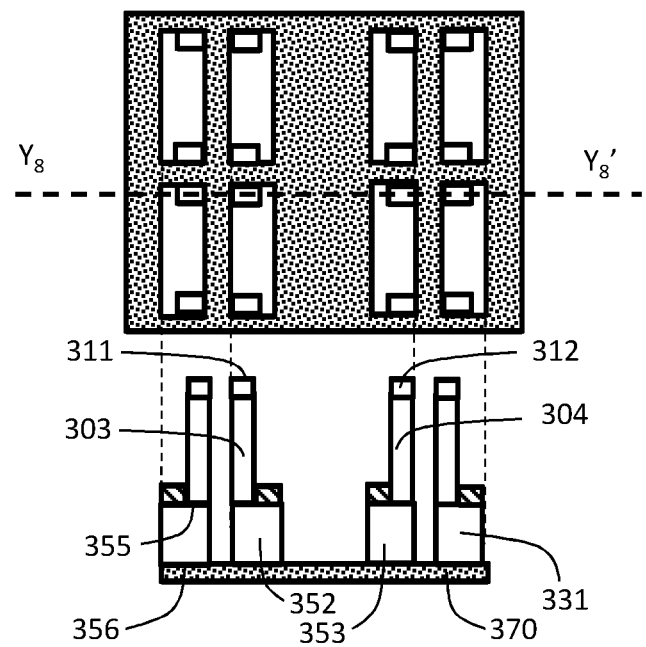

Finally, an adhesive 370 can be formed on the second surface 356 of the metallic substrate 351 (see FIG. 5H; a top view and a Y8-Y8' cross-sectional view). Please note that the first insulating layer 357 in FIG. 5G can be removed as shown in FIG. 5H.

Embodiment 2

Figure 6A:
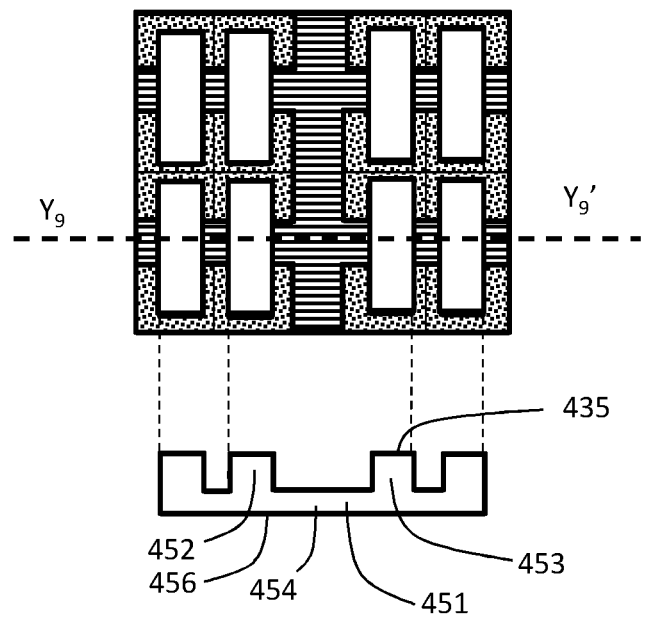
FIG. 6A to FIG. 6H illustrate a detailed process-flow-chart of manufacturing the leadframe in the second embodiment of the present invention.
Figure 6B:
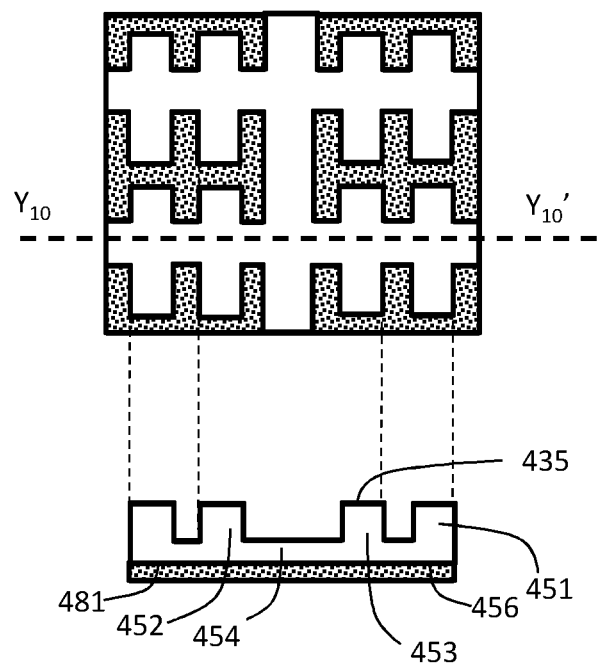
Figure 6C:
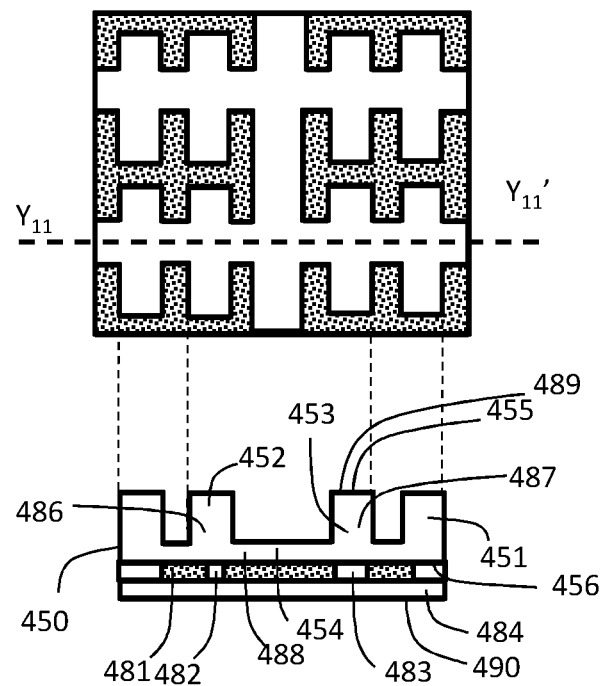

In the second embodiment of the present invention, the base material is a substrate 450 comprising a metallic plate 451 (e.g., Cu foil), an insulating material 481 (e.g., BT), a first via 482, a second via 483 and a first conductive layer 484 (see FIG. 6C). For convenience of explanation, only a local patterning process (e.g., lithography process) is shown; however, people skilled in the art can understand that the patterning process can be performed globally for mass production.

FIG. 6A illustrates a top view of a metallic substrate 451 after braunification and a Y9-Y9' cross-sectional view of the metallic substrate 451 after braunification. The metallic plate 451 comprises a first part 452, a second part 453 and a third part 454 between the first part 452 and the second part 453. The metallic plate 451 has a top surface 455 and a bottom surface 456 opposite to the top surface 455.

Then, an insulating material 481 (e.g., ABF resin) can be formed on the bottom surface 456 of the metallic plate 451 (see FIG. 6B; a top view and a Y10-Y10' cross-sectional view).

Then, a first via 482 and a second via 483 can be formed (e.g., laser-drilling, desmear and via plating) in the insulating material 481. Then, a first conductive layer 484 can be formed on the insulating material 481 to form a substrate 450 comprising the metallic plate 451, the insulating material 481, the first via 482, the second via 483 and the first conductive layer 484. The substrate 450 comprises a first portion 486, a second portion 487 and a third portion 488 between the first portion 486 and the second portion 487 (see FIG. 6C; a bottom view and a Y11-Y11' cross-sectional view). The substrate 450 has a first surface 489 and a second surface 490 opposite to the first surface 489.

Figure 6D:
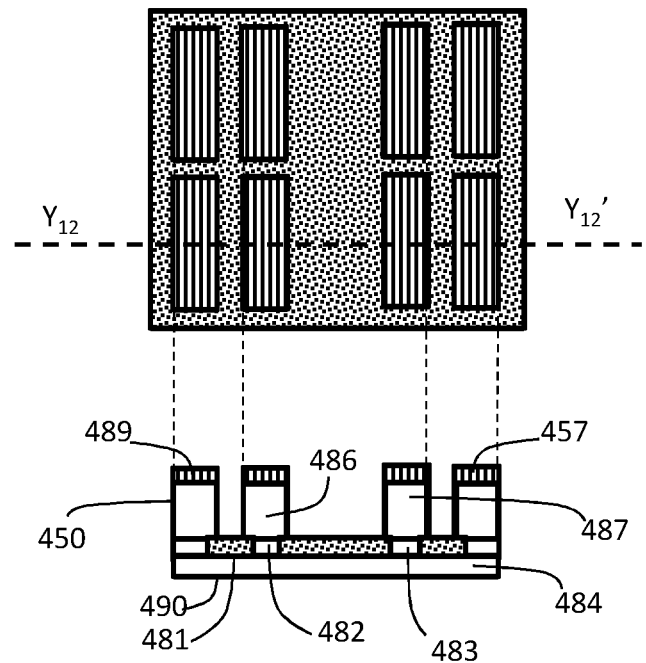

Then, a first insulating layer 457 can be formed on the first surface 489 of the substrate 450. Then, the third portion 488 of the substrate 450 can be removed by performing an etching process on the first surface 489 of the substrate 450 such that the top of the first portion 486 and the top of the second portion 487 is defined (see FIG. 6D; a top view and a Y12-Y12' cross-sectional view). Then, the first insulating layer 457 can be removed.

Figure 6E:
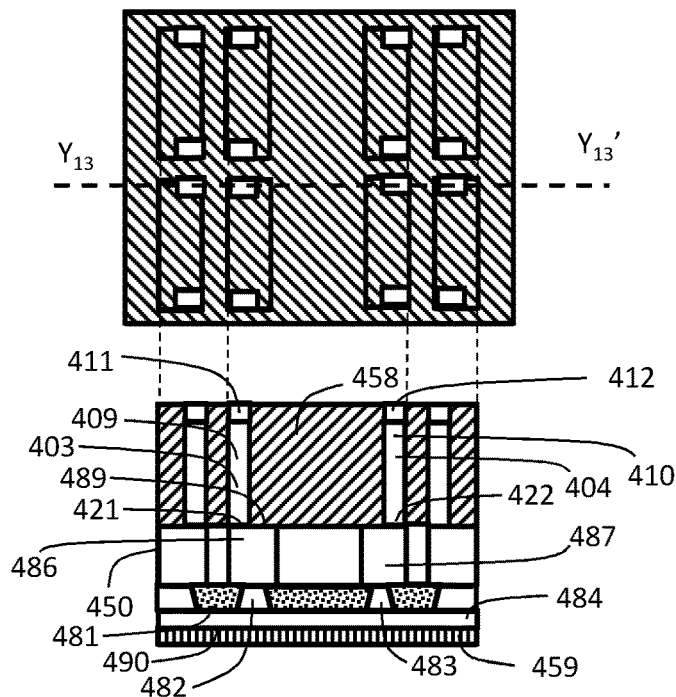

Then, a second insulating layer 458 (e.g., photoresistor) can be formed on the first surface 489 of the substrate 450. Then, a first through-hole 409 and a second through-hole 410 can be formed in the second insulating layer 458 on the first surface 489 of the substrate 450 to expose a first contact area 421 of the first portion 486 and a second contact area 422 of the second portion 487. Preferably, the first contact area 421 and the second contact area 422 are respectively located at the first corner of the first portion 486 and the second corner of the second portion 487 to form a maximum 3D space for accommodating at least one device 105. Then, a first conductive pillar 403 and a second conductive pillar 404 can be respectively formed on the first contact area 421 and the second contact area 422. Optional, a first bump 411 and a second bump 412 can be respectively formed on the first conductive pillar 403 and the second conductive pillar 404 (see FIG. 6E; a top view and a Y13-Y13' cross-sectional view). The first bump 411 and the second bump 412 can be formed by any suitable material, such as Cu/Sn. Then, a third insulating layer 459 can be formed on the second surface 490 of the substrate 450.

Figure 6F:
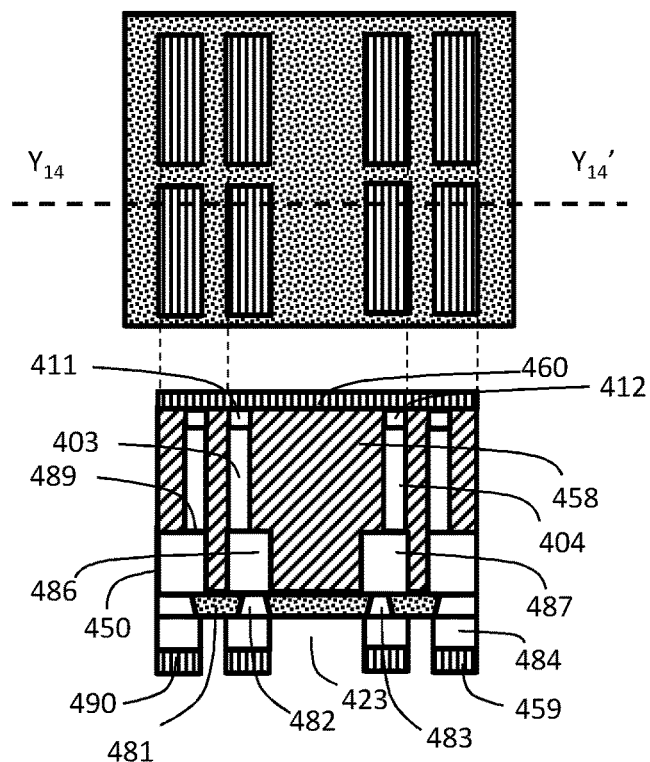

Then, a first through-trench 423 can be formed in the first conductive layer 484 and the third insulating layer 459 to expose the insulating material 481 such that the bottom of the first portion 486 and the bottom of the second portion 487 of the substrate 450 is defined (see FIG. 6F; a bottom view and a Y14-Y14' cross-sectional view). Then, a fourth insulating layer 460 can be formed on the second insulating layer 458.

Figure 6G:
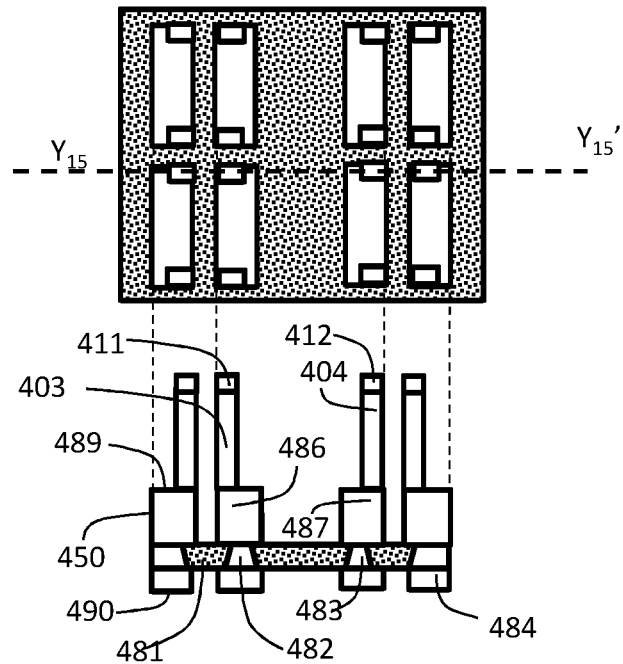

Then, the second insulating layer 458 (e.g., photoresistor), the third insulating layer 459 and the fourth insulating layer 460 can be removed to expose the insulating material 481 (see FIG. 6G; a top view and a Y15-Y15' cross-sectional view).

Figure 6H:
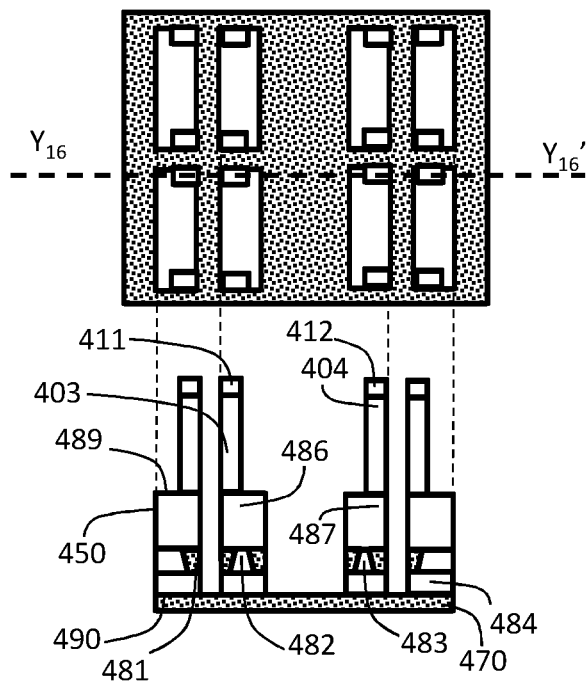

Finally, the insulating material 481 between the first portion 486 and the second portion 487 of the substrate 450 can be removed (e.g., laser drilling or mechanical drilling). Optionally, the insulating material 481 between the first portion 486 and the second portion 487 of the substrate 450 can be kept. The first portion 486 and the second portion 487 of the substrate 450 respectively forms the first lead 101 and the second lead 102 of the leadframe 100 spaced apart from each other. The metallic substrate 451 and the first conductive layer 484 can be electrically connected through the corresponding via 482, 483 in each of the first lead 101 and the second lead 102 of the leadframe 100. An adhesive 470 can be formed on the second surface 490 of the substrate 450 (see FIG. 6H; a top view and a Y16-Y16' cross-sectional view).

Embodiment 3

Figure 7A:
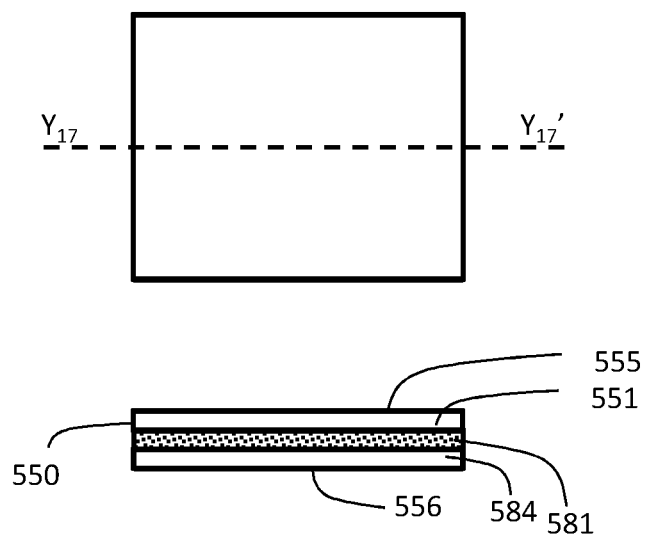
FIG. 7A to FIG. 7H illustrate a detailed process-flow-chart of manufacturing the leadframe in the third embodiment of the present invention.

In the third embodiment of the present invention, the base material is a substrate 550 (e.g., BT/copper foil) having a first conductive layer 551, a second conductive layer 584, and an insulating material 581 disposed between the first conductive layer 551 and the second conductive layer 584 (see FIG. 7A). For convenience of explanation, only a local patterning process (e.g., lithography process) is shown; however, people skilled in the art can understand that the patterning process can be performed globally for mass production.

FIG. 7A illustrates a top view of a substrate 550 after braunification and a Y17-Y17' cross-sectional view of the substrate 550 after braunification. The substrate 550 has a first surface 555 and a second surface 556 opposite to the first surface 555.

Figure 7B:
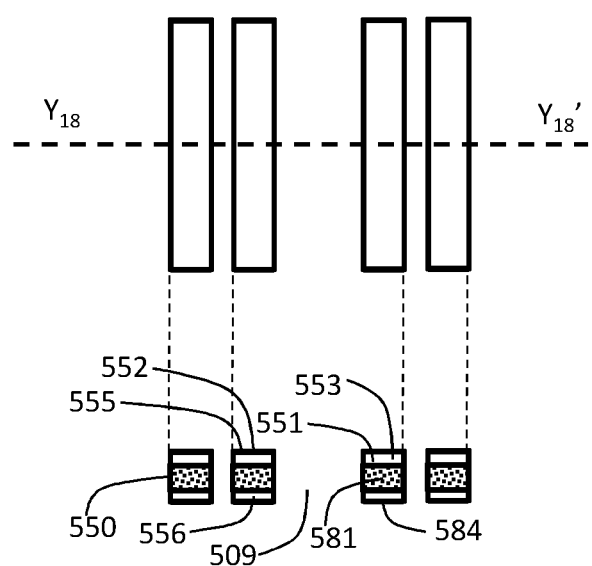

Then, a first through-trench 509 can be formed (e.g., mechanical drilling) in the substrate 550 to form a first portion 552 and a second portion 553 of the substrate 550 (see FIG. 7B; a top view and a Y18-Y18' cross-sectional view).

Figure 7C:
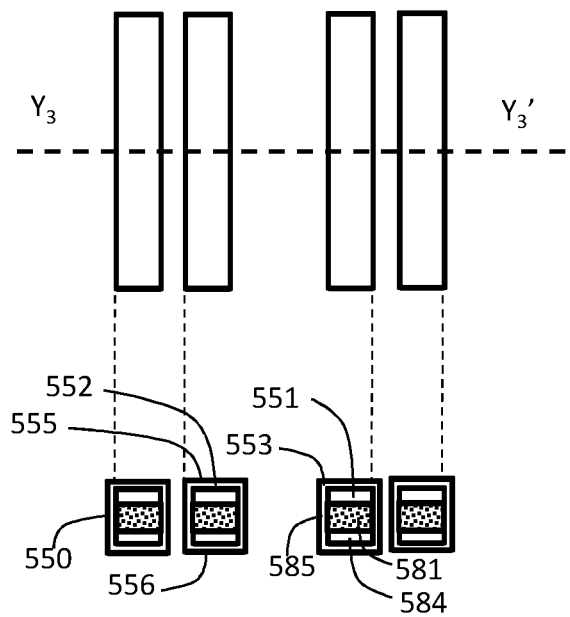

Then, a third conductive layer 585 can be formed (e.g., desmear and via plating) on the surface of each of the first portion 552 and the second portion 553 of the substrate 550 and incorporated into the first portion 552 and the second portion 553 of the substrate 550 (see FIG. 7C; a top view and a Y19-Y19' cross-sectional view).

Figure 7D:
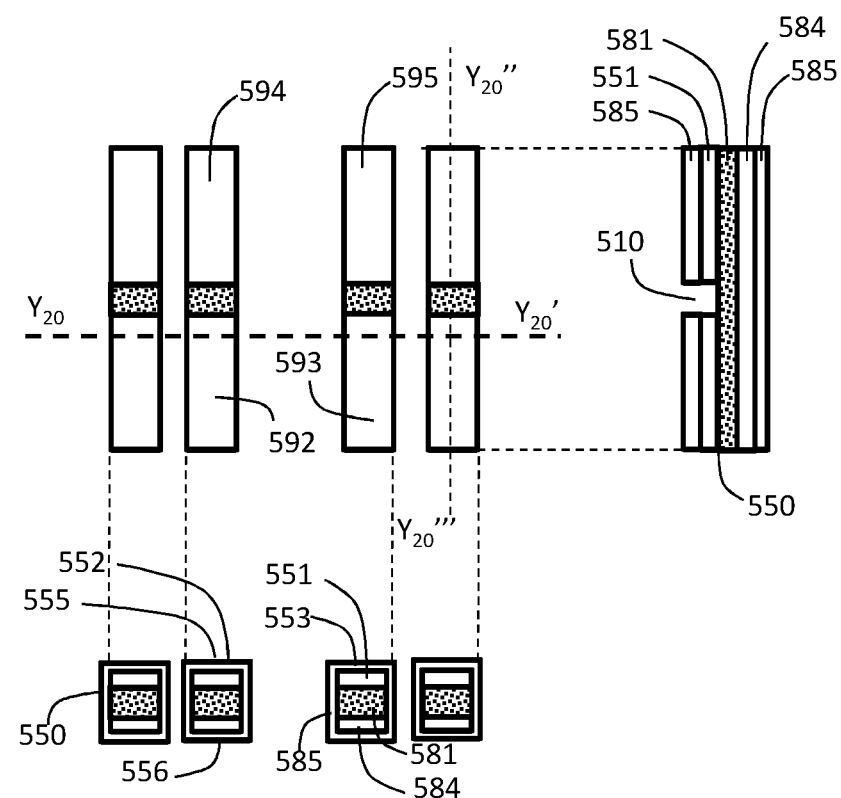

Then, a second through-trench 510 and a third through-trench 511 can be respectively formed in the first conductive layer 551 and the third conductive layer 585 such that the top of a third portion 592, the top of a fourth portion 593, the top of a fifth portion 594 and the top of a sixth portion 595 of the substrate 550 is defined (see FIG. 7D; a top view, a Y20-Y20' cross-sectional view and a Y20"-Y20'" cross-sectional view). The third portion 592 and the fourth portion 593 of the substrate 550 will respectively form the first lead 101 and the second lead 102 of the leadframe 100 spaced apart from each other, and they will be focused in the subsequent process. Please note that the subsequent process can be applied to the fifth portion 594 and the sixth portion 595 of the substrate 550.

Figure 7E:
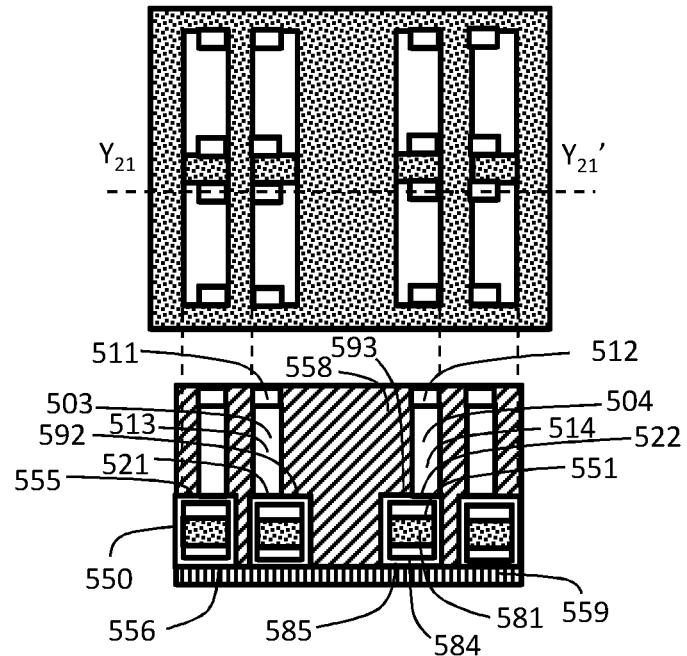

Then, a first insulating layer 558 (e.g., photoresistor) can be formed on the first surface 555 of the substrate 550 and between the third portion 592 and the fourth portion 593 of the substrate 550. Then, a first through-hole 513 and a second through-hole 514 can be formed in the first insulating layer 558 on the first surface 555 of the substrate 550 to expose a first contact area 521 of the third portion 592 and a second contact area 522 of the fourth portion 593. Preferably, the first contact area 521 and the second contact area 522 are respectively located at the first corner of the third portion 592 and the second corner of the fourth portion 593 to form a maximum 3D space for accommodating at least one device 105. Then, a first conductive pillar 503 and a second conductive pillar 504 can be respectively formed on the first contact area 521 and the second contact area 522. Optional, a first bump 511 and a second bump 512 can be respectively formed on the first conductive pillar 503 and the second conductive pillar 504 (see FIG. 7E; a top view and a Y21-Y21' cross-sectional view). The first bump 511 and the second bump 512 can be formed by any suitable material, such as Cu/Sn. Then, a second insulating layer 559 can be formed on the second surface 556 of the substrate 550.

Figure 7F:
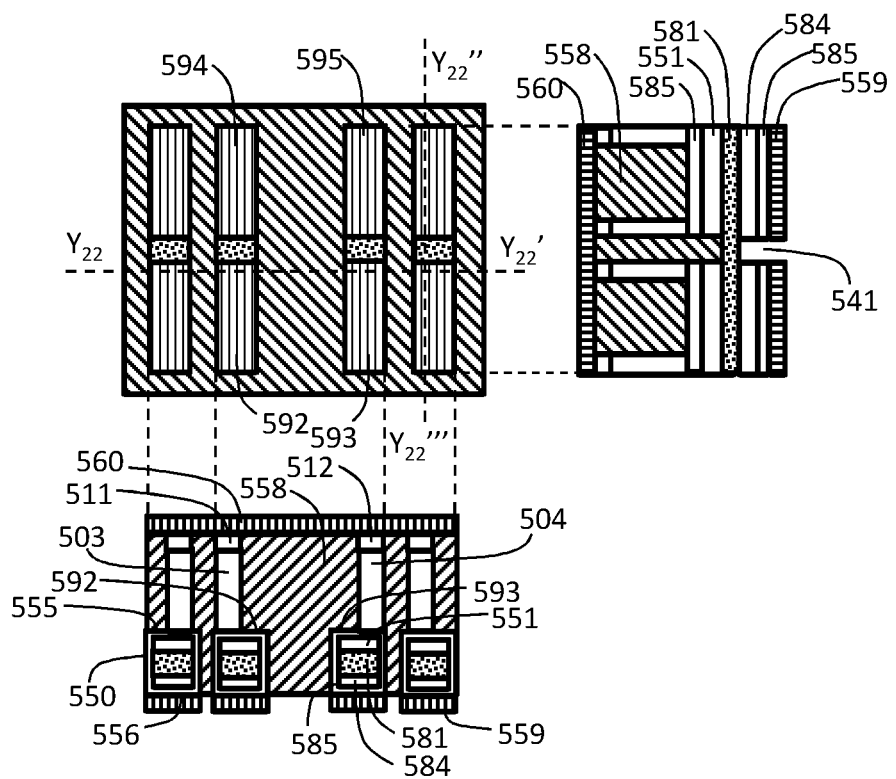

Then, a third insulating layer 560 can be formed on the first insulating layer 558. A second through-trench 541 can be formed in the second conductive layer 584 and the third conductive layer 585 such that the bottom of the third portion 592, the bottom of the fourth portion 593, the bottom of the fifth portion 594 and the bottom of the sixth portion 595 of the substrate 550 is defined (see FIG. 7F; a bottom view, a Y22-Y22' cross-sectional view and a Y22"-Y22'" cross-sectional view).

Figure 7G:
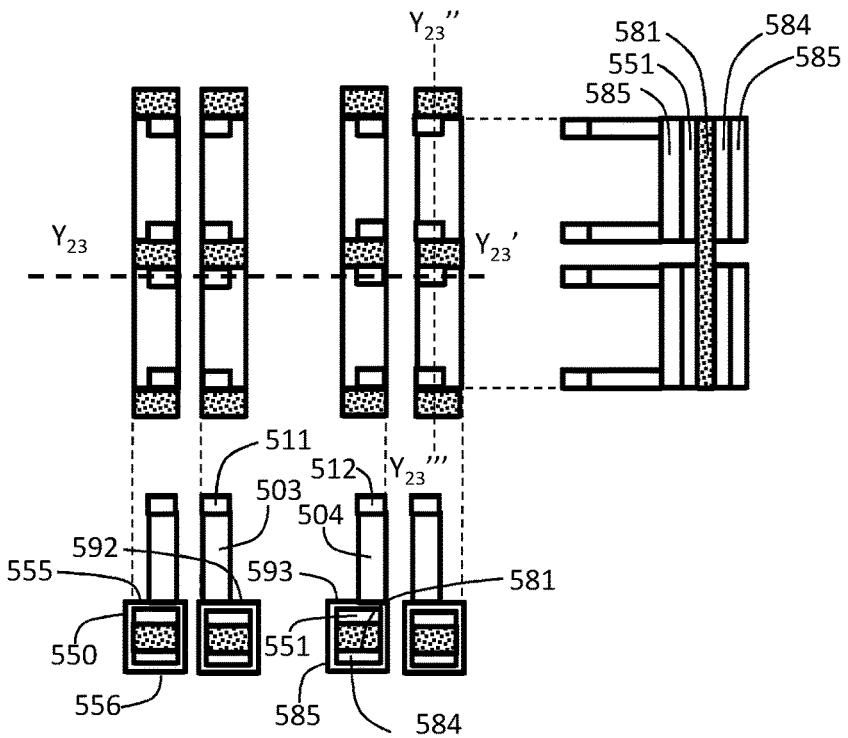

Then, the first insulating layer 558 (e.g., photoresistor), the second insulating layer 559 and the third insulating layer 560 can be removed to expose the insulating material 581 (see FIG. 7G; a top view, a Y23-Y23' cross-sectional view and a Y23"-Y23'" cross-sectional view).

Figure 7H:
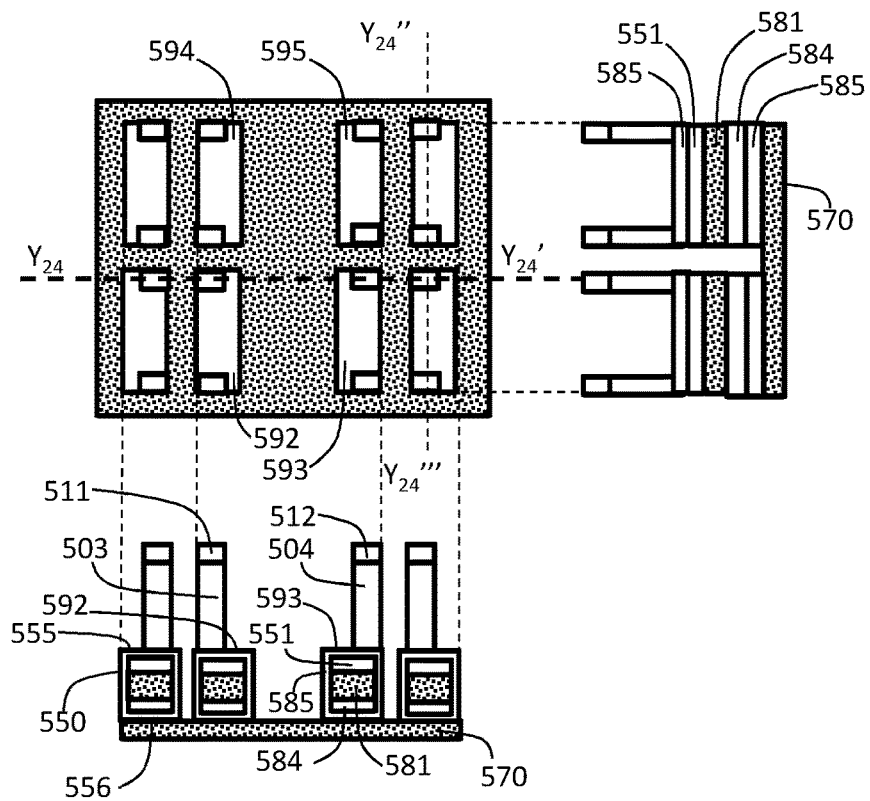

Finally, the insulating material 581 between the third portion 592 and the fifth portion 594 of the substrate 550 and the fourth portion 593 and the sixth portion 595 of the substrate 550 can be removed (e.g., laser drilling or mechanical drilling). The third portion 592 and the fourth portion 593 of the substrate 550 respectively form the first lead 101 and the second lead 102 of the leadframe 100 spaced apart from each other. The first conductive layer 551 and the second conductive layer 584 can be electrically connected through the third conductive layer 585 in each of the first lead 101 and the second lead 102 of the leadframe 100. An adhesive 570 can be formed on the second surface 556 of the substrate 550 (see FIG. 7H; a top view, a Y24-Y24' cross-sectional view and a Y24"-Y24'" cross-sectional view).

Embodiment 4

Figure 8A:
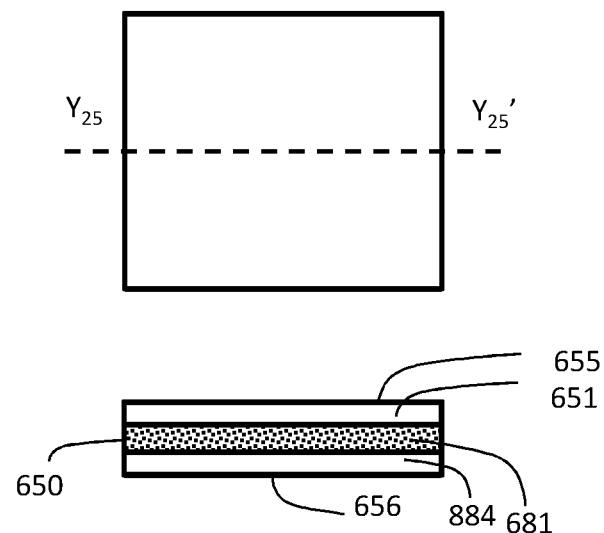
FIG. 8A to FIG. 8H illustrate a detailed process-flow-chart of manufacturing the leadframe in the fourth embodiment of the present invention.

In the fourth embodiment of the present invention, the base material is a substrate 650 (e.g., BT/copper foil) having a first conductive layer 651, a second conductive layer 684, and an insulating material 681 disposed between the first conductive layer 651 and the second conductive layer 684 (see FIG. 8A). For convenience of explanation, only a local patterning process (e.g., lithography process) is shown; however, people skilled in the art can understand that the patterning process can be performed globally for mass production.

FIG. 8A illustrates a top view of a substrate 650 after braunification and a Y25-Y25' cross-sectional view of the substrate 650 after braunification. The substrate 650 has a first surface 655 and a second surface 656 opposite to the first surface 655.

Figure 8B:
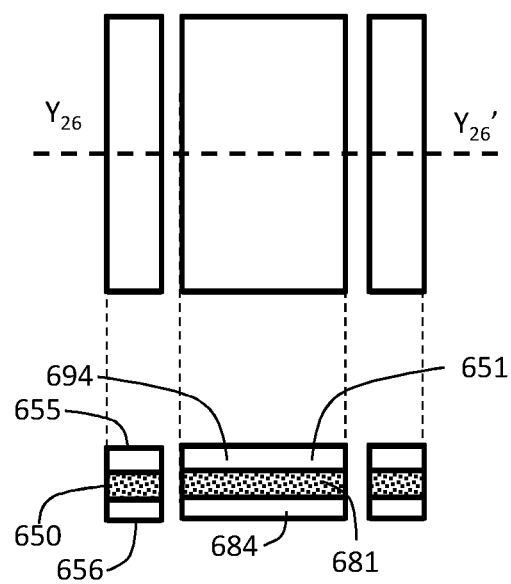

Then, a first portion 691 of the substrate 650 can be formed (e.g., mechanical drilling) (see FIG. 8B; a top view and a Y26-Y26' cross-sectional view).

Figure 8C:
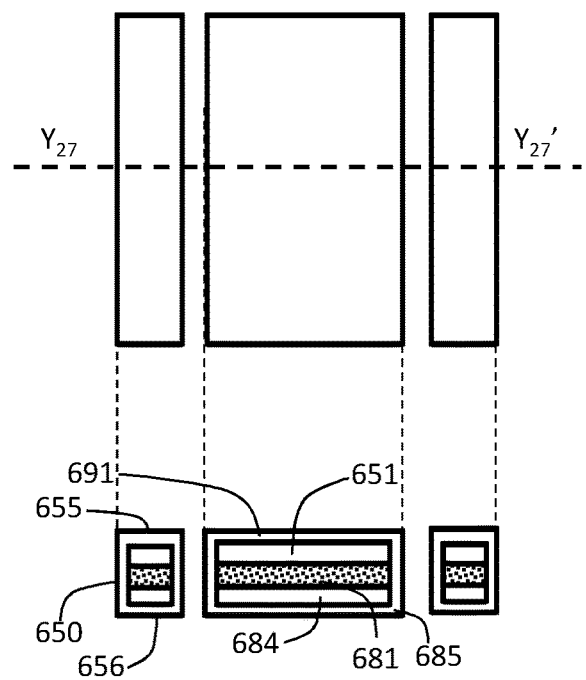

Then, a third conductive layer 685 can be formed (e.g., desmear and via plating) on the surface of the first portion 691 of the substrate 650 and incorporated into the first portion 691 of the substrate 650 (see FIG. 8C; a top view and a Y27-Y27' cross-sectional view).

Figure 8D:
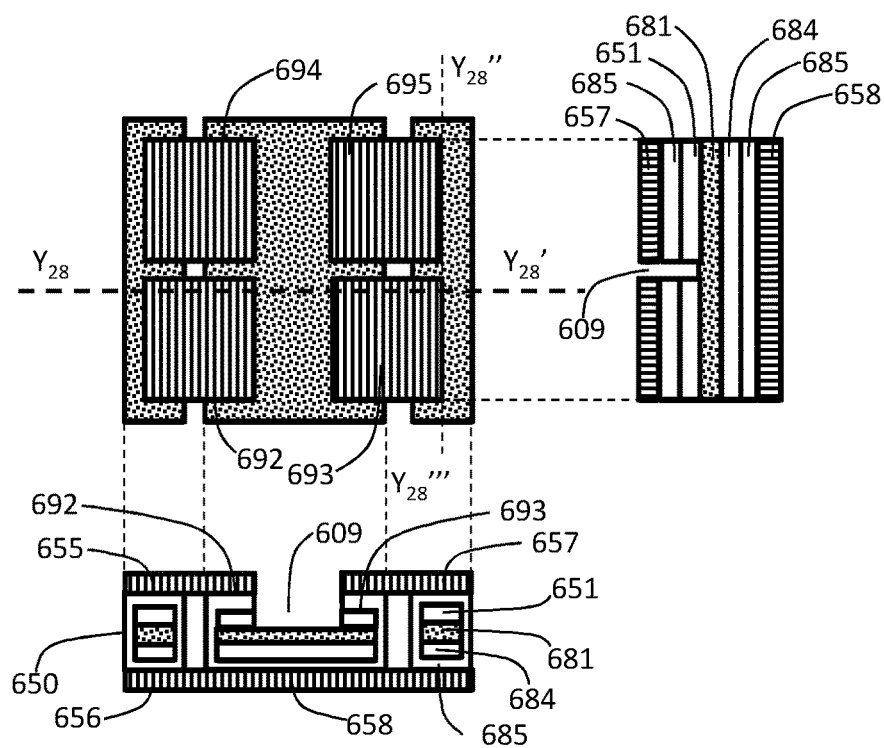

Then, a first insulating layer 657 can be formed on the first surface 655 of the substrate 650 and a second insulating layer 658 can be formed on the second surface 656 of the substrate 650. The first through-trench 609 can be formed in the first insulating layer 657, the third conductive layer 685 and the first conductive layer 651 to expose the insulating material 681 such that the top of a second portion 692, the top of a third portion 693, the top of a fourth portion 694 and the top of a fifth portion 695 of the substrate 650 is defined. The second portion 692 and the third portion 693 of the substrate 650 respectively will form the first lead 101 and the second lead 102 of the leadframe 100 spaced apart from each other, and they will be focused in the subsequent process (see FIG. 8D; a top view, a Y28-Y28' cross-sectional view and a Y28"-Y28'" cross-sectional view). Please note that the subsequent process can be applied to the fourth portion 694 and the fifth portion 695 of the substrate 650.

Figure 8E:
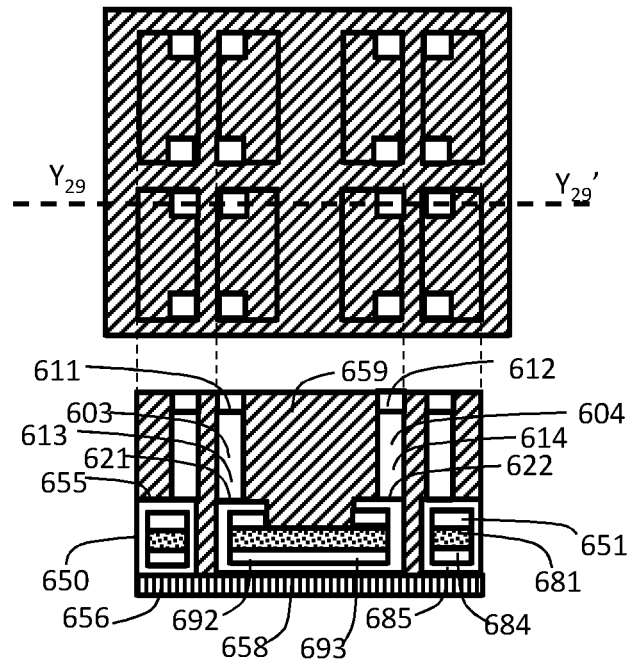

Then, the first insulating layer 657 can be removed. Then, a third insulating layer 659 (e.g., photoresistor) can be formed on the first surface 655 of the substrate 650 and between the second portion 692 and the third portion 693 of the substrate 650. Then, a first through-hole 613 and a second through-hole 614 can be formed in the third insulating layer 659 on the first surface 655 of the substrate 650 to expose a first contact area 621 of the second portion 692 and a second contact area 622 of the third portion 693. Preferably, the first contact area 621 and the second contact area 622 are respectively located at the first corner of the second portion 692 and the second corner of the third portion 693 to form a maximum 3D space for accommodating at least one device 105. Then, a first conductive pillar 603 and a second conductive pillar 604 can be respectively formed on the first contact area 621 and the second contact area 622. Optional, a first bump 611 and a second bump 612 can be respectively formed on the first conductive pillar 603 and the second conductive pillar 604 (see FIG. 8E; a top view and a Y29-Y29' cross-sectional view). The first bump 611 and the second bump 612 can be formed by any suitable material, such as Cu/Sn.

Figure 8F:
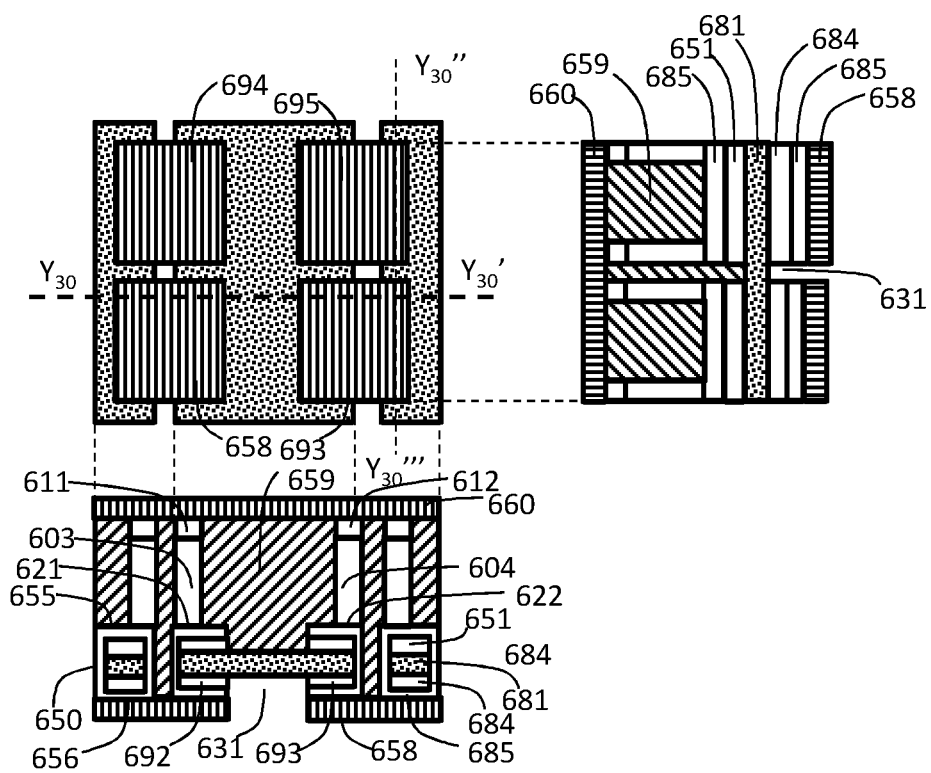

Then, a fourth insulating layer 660 can be formed on the third insulating layer 659. Then, second through-trench 631 can be formed in the second conductive layer 684, the third conductive layer 685 and the second insulating layer 658 to expose the insulating material 681 such that the bottom of a second portion 692, the bottom of a third portion 693, the bottom of a fourth portion 694 and the bottom of a fifth portion 695 of the substrate 650 is defined (see FIG. 8F; a bottom view, a Y30-Y30' cross-sectional view and a Y30"-Y30'" cross-sectional view).

Figure 8G:
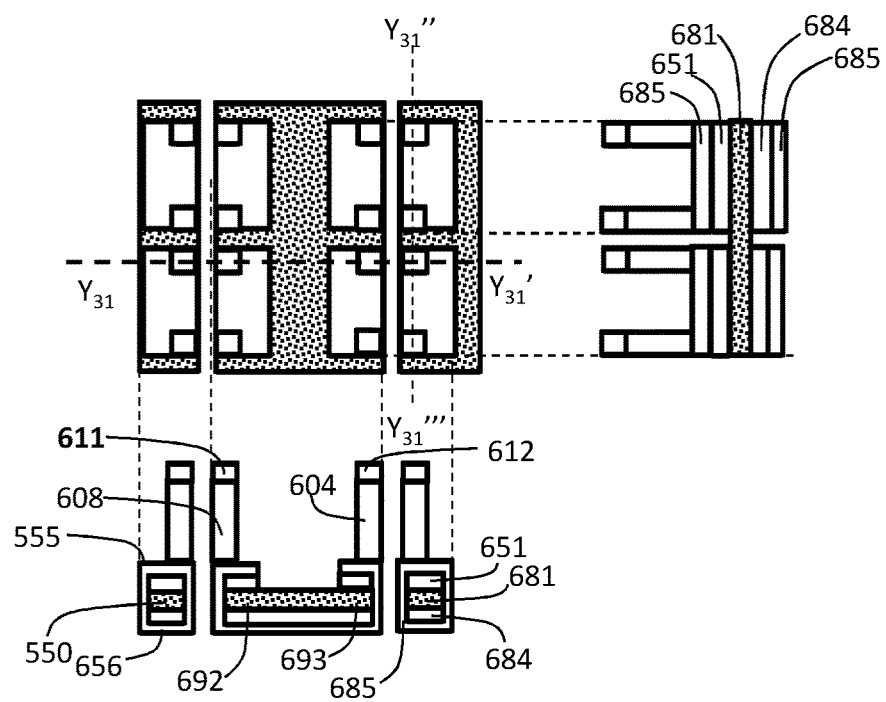

Then, the second insulating layer 658, the third insulating layer 659 (e.g., photoresistor) and the fourth insulating layer 660 can be removed to expose the insulating material 681 (see FIG. 8G; a top view, a Y31-Y31' cross-sectional view and a Y31"-Y31'" cross-sectional view).

Figure 8H:
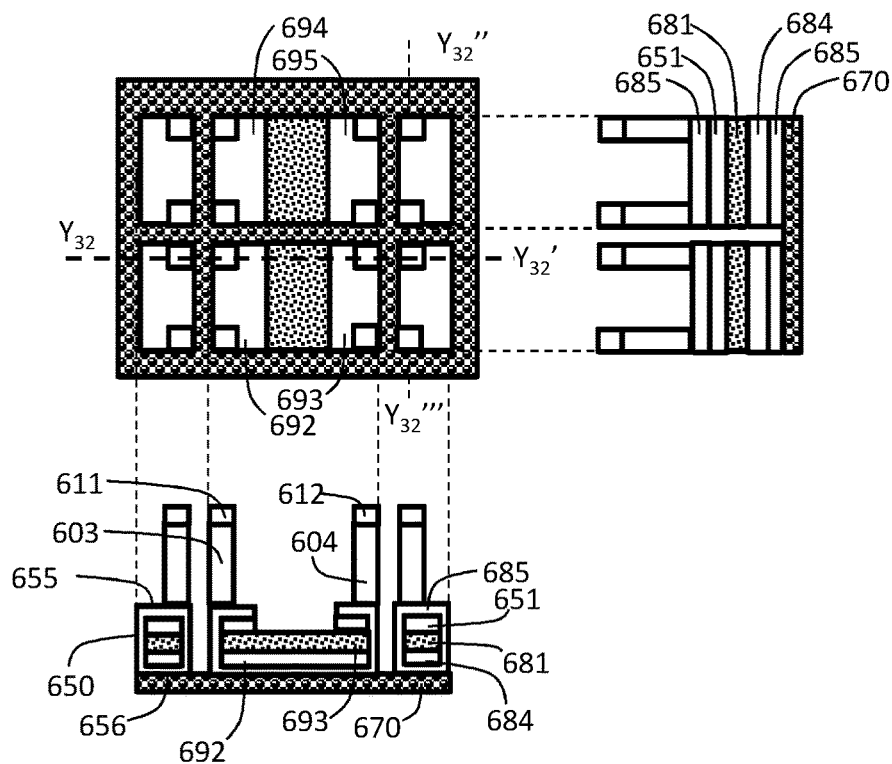

Finally, the insulating material 681 between the second portion 692 and the fourth portion 694 of the substrate 650 and the third portion 693 and the fifth portion 695 of the substrate 650 can be removed (e.g., laser drilling or mechanical drilling). The second portion 692 and the third portion 693 of the substrate 650 respectively forms the first lead 101 and the second lead 102 of the leadframe 100 spaced apart from each other and the insulating material 681 disposed between the first lead 101 and the second lead 102 serves as a supporting material 107 to support at least one device 105. The first conductive layer 651 and the second conductive layer 684 can be electrically connected through the third conductive layer 685 in each of the first lead 101 and the second lead 102 of the leadframe 100. An adhesive 670 can be formed on the second surface 656 of the substrate 650 (see FIG. 8H; a top view, a Y32-Y32' cross-sectional view and a Y32"-Y32'" cross-sectional view).

It follows from description of the above embodiments that the leadframe in the present invention and the method for manufacturing the same can offer many advantages including: 1. the size of the device can be controlled and design flexibility can be enhanced according to the requirement so that it's suitable for mass production; 2. it's wider than molding formation in application, and it can match the wire-winding so no fixture wearing is generated; 3. the process can performed in sheet; compared to the process performed in a single device-production, process-positioning can be enhanced and the product yield can be improved; 4. it's suitable for high-density layout design, and the conductive pillars with high aspect ratio can prevent the adjacent electronic component from short circuit; 5. supporting material can overcome the deformation of the leadframe and the variance of the device size.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An electrical component, comprising:
   a substrate, comprising a first portion, a second portion and at least one third portion between the first portion and the second portion, wherein a first conductive pillar is formed on the first portion of the substrate, and a second conductive pillar is formed on the second portion of the substrate, wherein the first conductive pillar, the second conductive pillar and the at least one third portion form a 3D space;
   at least one device, disposed in the 3D space, wherein at least one portion of the at least one device is disposed below the top surface of the first conductive pillar and above each of the top surface of the at least one third portion and the bottom surface of the first conductive pillar, wherein the bottom surface of the first conductive pillar is on the substrate with an inner side surface of the first conductive pillar facing the second conductive pillar and an outer side surface of the first conductive pillar being opposite to said inner side surface, wherein no part of said at least one device is located outside said outer side surface of the first conductive pillar, wherein a first terminal and a second terminal of the at least one device are respectively electrically connected to the first conductive pillar and the second conductive pillar.

2. The electrical component according to claim 1, wherein a first electrode is disposed under a bottom surface of the first portion of the substrate and a second electrode is disposed under a bottom surface of the second portion of the substrate, wherein the first terminal and the second terminal of the at least one device are electrically connected to the first electrode and the second electrode through the top surface of the first conductive pillar and the top surface of the second conductive pillar, respectively.

3. The electrical component according to claim 2, wherein the at least one device is a magnetic device having a coil, wherein the coil has a first terminal and a second terminal, wherein the first electrode is electrically connected to the first terminal of the coil through the first conductive pillar, and the second electrode is electrically connected to the second terminal of the coil through the second conductive pillar.

4. The electrical component according to claim 1, wherein the substrate is a metal plate, wherein the at least one third portion of the metal plate has a vacancy located between the first portion and the second portion of the metal plate.

5. The electrical component according to claim 4, wherein the first conductive pillar and the second conductive pillar are respectively formed on a first corner of the first portion of the metal plate and a second corner of the second portion of the metal plate.

6. The electrical component according to claim 1, wherein the substrate is a metallic substrate, wherein the metallic substrate comprises an insulating core, wherein at least one conductive layer is disposed on the insulating core so as to form the metallic substrate.

7. The electrical component according to claim 1, wherein the substrate is a metallic substrate, wherein the metallic substrate comprises an insulating core, and copper material is coated on the top surface and the bottom surface of the insulating core so as to form the metallic substrate.

8. The electrical component according to claim 1, wherein an adhesive layer is disposed under the first portion, the second portion and the at least one third portion of the substrate.

9. The electrical component according to claim 1, wherein the at least one third portion of the substrate has a vacancy located between the first portion and the second portion of the substrate, wherein an adhesive layer is disposed under the first portion, the second portion and the at least one third portion of the substrate.

10. The electrical component according to claim 1, wherein the top surface of the first conductive pillar and the top surface of the second conductive pillar are substantially at the same horizontal level.

11. The electrical component according to claim 1, further comprising a first bump and a second bump respectively disposed on the first conductive pillar and the second conductive pillar for connecting with the at least one device.

12. The electrical component according to claim 1, further comprising a third conductive pillar and a fourth conductive pillar respectively formed over a fourth portion and a fifth portion of the substrate.

13. The electrical component according to claim 12, wherein the top surface of the first conductive pillar, the top surface of the second conductive pillar, the top surface of the third conductive pillar and the top surface of the fourth conductive pillar are substantially at the same horizontal level.

14. The electrical component according to claim 1, wherein an insulating layer is disposed on the first portion, the second portion and the at least one third portion of the substrate, wherein the at least one device is disposed on the insulating layer.

15. An inductor, comprising:
   a substrate, comprising a first portion, a second portion and at least one third portion between the first portion and the second portion, wherein a first conductive pillar is formed over the first portion of the substrate, and a second conductive pillar is formed over the second portion of the substrate, wherein the first conductive pillar, the second conductive pillar and the at least one third portion form a 3D space;

a coil, disposed in the 3D space, wherein at least one portion of the coil is disposed below the top surface of the first conductive pillar and above each of the top surface of the at least one third portion and the bottom surface of the first conductive pillar, wherein the bottom surface of the first conductive pillar is on the substrate with an inner side surface of the first conductive pillar facing the second conductive pillar and an outer side surface of the first conductive pillar being opposite to said inner side surface, wherein no part of said coil is located outside said outer side surface of the first conductive pillar, wherein a first terminal and a second terminal of the coil are respectively electrically connected to the first conductive pillar and the second conductive pillar.

16. The inductor according to claim 15, wherein a first electrode is disposed under a bottom surface of the first portion of the substrate and a second electrode is disposed under a bottom surface of the second portion of the substrate, wherein the first terminal and the second terminal of the coil are electrically connected to the first electrode and the second electrode through the top surface of the first conductive pillar and the top surface of the second conductive pillar, respectively.

17. The inductor according to claim 15, wherein the substrate is a metal plate, wherein the at least one third portion of the metal plate has a vacancy located between the first portion and the second portion of the metal plate.

18. The inductor according to claim 15, wherein the first conductive pillar and the second conductive pillar are respectively formed on a first corner of the first portion of the metal plate and a second corner of the second portion of the metal plate.

19. The inductor according to claim 15, wherein the substrate is a metallic substrate, wherein the metallic substrate comprises an insulating core, wherein at least one conductive layer is disposed on the insulating core so as to form the metallic substrate.

20. The inductor according to claim 15, wherein the substrate is a metallic substrate, wherein the metallic substrate comprises an insulating core, and copper material is coated on the top surface and the bottom surface of the insulating core so as to form the metallic substrate.

* * * * *